(12) United States Patent
de Castro et al.

(10) Patent No.: US 10,055,034 B2
(45) Date of Patent: Aug. 21, 2018

(54) HAPTIC FEEDBACK SYSTEM

(71) Applicant: Google Inc., Mountain View, CA (US)

(72) Inventors: Alexandra Maria Fernandes de Castro, London (GB); Jayme Ross Goldstein, London (GB); Zebedee Pedersen, Cuckfield (GB); Joao Henrique Santos Wilbert, London (GB); Hana Tanimura, London (GB); William Marlyan Carey, San Francisco, CA (US); Iain Roberts, Mill Valley, CA (US); Nicholas Inzucchi, San Francisco, CA (US); Ted Larson, Los Altos, CA (US); Brandon Blodget, Santa Clara, CA (US); Michael Peter Thompson, San Carlos, CA (US); Paulo Blikstein, San Francisco, CA (US); Stavros Vranakis, Hove (GB)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/339,409

(22) Filed: Oct. 31, 2016

(65) Prior Publication Data

US 2017/0371430 A1 Dec. 28, 2017

Related U.S. Application Data

(60) Provisional application No. 62/355,076, filed on Jun. 27, 2016.

(51) Int. Cl.
*G09G 5/00* (2006.01)
*G06F 3/0362* (2013.01)
(Continued)

(52) U.S. Cl.
CPC ............ *G06F 3/0362* (2013.01); *B60K 37/02* (2013.01); *B60Q 9/00* (2013.01); *G06F 3/016* (2013.01);
(Continued)

(58) Field of Classification Search
CPC ......... G06F 3/0362; G06F 3/016; B60Q 9/00; B60K 37/02; B60K 2350/402; B60K 2350/35
See application file for complete search history.

(56) References Cited

U.S. PATENT DOCUMENTS 9,754,078 B2 * 9/2017 Ramsay ................. A61B 5/486
2004/0100440 A1 5/2004 Levin et al.
(Continued)

FOREIGN PATENT DOCUMENTS

WO WO 2015/033033 3/2015

OTHER PUBLICATIONS

International Search Report and Written Opinion from PCT/US2017/039382 dated Oct. 17, 2017, 11 pages.
(Continued)

*Primary Examiner* — Erin M File
(74) *Attorney, Agent, or Firm* — Dority & Manning, P.A.

(57) ABSTRACT

Systems and methods associated for providing haptic feedback are provided. For instance, data indicative of a feedback scheme associated with an input mechanism can be accessed. The feedback scheme includes one or more feedback points associated with a position of a moveable portion of the input mechanism. The input mechanism is configured to change positions responsive to an actuation of the input mechanism by a user. One or more positions of the moveable portion of the input mechanism can be determined as the input mechanism is actuated by the user. Operation of one or more feedback motors can be controlled to provide feedback
(Continued)

to the user in accordance with the feedback scheme based at least in part on the determined one or more positions of the input mechanism.

20 Claims, 7 Drawing Sheets

(51) Int. Cl.
    *G06F 3/01*          (2006.01)
    *B60Q 9/00*        (2006.01)
    *B60K 37/02*      (2006.01)
(52) U.S. Cl.
    CPC .... *B60K 2350/35* (2013.01); *B60K 2350/402* (2013.01)

(56) References Cited

U.S. PATENT DOCUMENTS

| 2010/0034400 | A1* | 2/2010 | Aiso | G06F 3/0362 |
| | | | | 381/119 |
| 2010/0141407 | A1* | 6/2010 | Heubel | G06F 1/163 |
| | | | | 340/407.1 |
| 2013/0154627 | A1 | 6/2013 | Pfenning | |
| 2014/0098038 | A1* | 4/2014 | Paek | G06F 1/1692 |
| | | | | 345/173 |

OTHER PUBLICATIONS

Written Opinion of the International Preliminary Examining Authority for PCT/US2017/039382 dated May 30, 2018, 6 pages.

* cited by examiner

HAPTIC FEEDBACK SYSTEM

PRIORITY CLAIM

This application claims priority to U.S. Provisional Patent Application Ser. No. 62/355,076 entitled "Modular Computing Environment," filed on Jun. 27, 2016.

FIELD

The present disclosure relates generally to providing haptic feedback to a user based at least in part on a feedback scheme.

BACKGROUND

Many user interface devices, such as dials, knobs, sliders, switches, toggles, faders, etc. can provide a form of feedback to the user to provide the user with contextual information as to the position or configuration of the device. For instance, a mechanical dial may include one or more detents or notches configured to resist the motion of the dial to provide such feedback. Many user interface devices can be configured to perform multiple applications depending on a context in which the user interface device is operated. For instance, a knob or dial associated with an automobile dash interface can be configured to control an air conditioning system and a volume of an audio system associated with the automobile at separate times as desired by a user. In such implementations, each application may have different feedback requirements. In such instances, conventional mechanical feedback mechanisms may be unable to provide intuitive and informative feedback for each of the multiple applications.

SUMMARY

Aspects and advantages of embodiments of the present disclosure will be set forth in part in the following description, or may be learned from the description, or may be learned through practice of the embodiments.

One example aspect of the present disclosure is directed to a computer-implemented method of providing feedback control. The method includes accessing, by one or more processors, data indicative of a feedback scheme associated with an input mechanism. The feedback scheme includes one or more feedback points associated with a position of a moveable portion of the input mechanism. The input mechanism is configured to change positions responsive to an actuation of the input mechanism by a user. The method further includes determining, by the one or more processors, one or more positions of the moveable portion of the input mechanism as the input mechanism is actuated by the user. The method further includes controlling, by the one or more processors, operation of one or more feedback motors to provide feedback to the user in accordance with the feedback scheme based at least in part on the determined one or more positions of the input mechanism.

Other example aspects of the present disclosure are directed to systems, apparatus, tangible, non-transitory computer-readable media, user interfaces, memory devices, and electronic devices for providing feedback to a user based on a feedback scheme.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
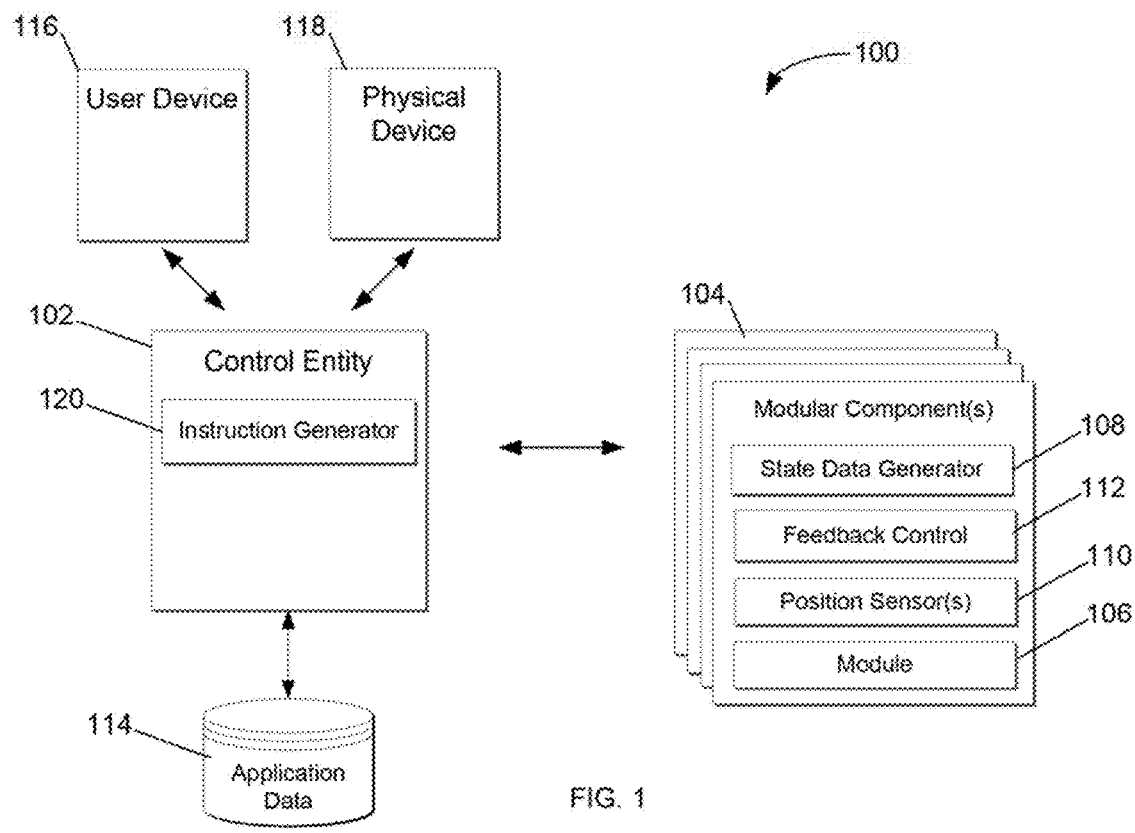
FIG. 1 depicts an overview of an example system for controlling one or more devices based on a modular computing environment according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to modular computing environments. For instance, a modular computing environment can include a control entity and one or more modular components configured to directly or indirectly couple to the control entity. The modular components can be configured to attach to the control entity and/or to one or more additional modular components. In this manner, a chain of modular components (e.g. modular chain) can be coupled to the control entity. Each modular component can be configured to receive a module. For instance, a module can be a device configured to attach to, fit within, or otherwise make contact with a modular component to pair with the modular component. The module can include an identification signature that can be read by a modular component, for instance, upon a reception of the module by the modular component. The module can specify a function to be performed by an external device, for instance, in the context of an application selected by a user of the modular computing environment and/or the external device. For instance, in some implementations, the function can be a function associated with controlling an operation of a robot device, or other device, such as move, jump, turn right, turn left, rotate 90 degrees, etc. As another example, the function can be a function for controlling operation of a digital application executed, for instance, on a user computing device. In some implementations, the function can be encoded in the identification signature of the module.

The module can be a static module or a dynamic module. For instance, a static module can specify an invariable function (e.g. in the context of an application). In this manner, the function specified by a static module can remain constant within the context of an application. A dynamic module can specify a variable function. For instance, a dynamic module can include an input mechanism capable of receiving an input by a user. The input mechanism can be a rotatable dial, a knob, a switch, a toggle, a fader device, a button, or other suitable input mechanism capable of receiving an input by a user. In this manner, the function to be performed specified by a dynamic module can be determined based at least in part on a position or state of the input mechanism. As an example, if the function associated with a dynamic module specifies a rotation command for a robot device within a control application associated with the robot, the user can interact with the input mechanism to control a degree of rotation to be performed by the robot device. In some implementations, the modules can be "dumb" modules that do not have internal processing capabilities. In this manner, the modules must be paired with a modular component to facilitate a provision of an instruction for use in the implementations of an application.

Upon reception of a module by a modular component in a modular chain coupled to the control entity, the modular component can be configured to determine state data associated with the modular component. For instance, the state data can include the identification signature of the paired module, a position data associated with the paired module (e.g. when the paired module is a dynamic module), and/or a configuration context of the modular component within the modular chain.

In some implementations, the identification signature can be a capacitive identification signature. For instance, the module can include one or more capacitive pads arranged in a predefined configuration that specifies an identification signature of the module. The capacitive pads can be made from various suitable conductive materials, such as capacitive ink, conductive thread, conductive tape, metal, PCB, etc. The capacitive pads can be attached to or otherwise located on a bottom surface of the module, such that the bottom surface of the module can be configured to make contact with a capacitive sensor located on an upper surface of a corresponding modular component. The capacitive sensor can be configured to identify the configuration of the capacitive pads. The modular component can determine the identification signature of the module based at least in part on the identified configuration of the capacitive pads. In some implementations, the capacitive identification signature can be an 8-bit signature represented in a hexadecimal format.

The position data can be used to determine a control value associated with a function. More particularly, the control value can be determined based at least in part on a position and/or state of an input mechanism associated with a dynamic module. For instance, the modular components can further include one or more position sensors. The positions sensor(s) can include or otherwise be associated with one or more Hall-effect sensors, magnetometers, rotary position sensors, or other suitable position sensors. The position sensor(s) can determine position data (angular position of a rotatable dial or knob, a state of a switch or button, fader position, slider position, etc.) associated with the input mechanism of a dynamic module. For instance, when a dynamic module is paired with a modular component, the position sensor(s) can detect the corresponding input mechanism and determine a position of the input mechanism. In this manner, as the user interacts with the input mechanism to change the position of the input mechanism (e.g. by rotating a dial, flipping a switch, pressing a button, sliding a fader or slider device, etc.), the position sensor(s) can detect the change in position interpret the new position of the input mechanism.

In some implementations, the position sensor(s) can be configured to detect a position of a magnet embedded within or otherwise attached to a moveable portion of the input mechanism. In this manner, the position of the magnet can correspond to the position of the input mechanism, such that when the user interacts with the input mechanism to cause the input mechanism to change positions, the magnet changes positions as well. The position sensor(s) can be configured to detect the position of the magnet based at least in part on variations in the magnetic field and/or a polarity associated with the magnet as the magnet changes positions.

The configuration context of the modular component within the modular chain can specify a position and/or orientation of the modular component within the modular chain. For instance, a modular component within the modular chain can communicate with one or more additional modular components within the modular chain to determine the position and/or orientation of the modular component relative to the other modular components within the modular chain.

In some implementations, the modular components can include one or more output devices configured to provide feedback to the user. For instance, the modular components can include a lighting feedback device a haptic feedback device, and/or other suitable feedback devices. The lighting feedback device can include one or more lighting elements, such as one or more light emitting diodes (LEDs). In some implementations, the lighting elements can include or more RGB LEDs. The lighting components can be triggered individually by the control entity to provide specific feedback locally on each modular component. The haptic feedback device can include one or more haptic motors (e.g. vibration motors) that can be triggered to provide specific feedback locally on each modular component. For instance, the haptic motor can be triggered as the user actuates the input mechanism of a dynamic module. As will be described below, operation of the haptic motor can be controlled to provide feedback (e.g. vibratory feedback) at one or more feedback points in accordance with a specified feedback scheme as the user actuates the input mechanism.

Upon receiving the state data from each modular component within the modular chain, the control entity can determine an instruction set to be performed. For instance, the control entity can translate the state data of the modular chain to an executable structure capable of being read by the external device. More particularly, the control entity can map the identification signatures associated with the state data to corresponding application functions. The control entity can further specify corresponding control values as arguments within the application function. In this manner, raw position data determined by the modular component can be mapped to a control value that specifies a predefined argument for a function within the context of an application. The instruction set can be associated with an application. For instance, the application can be selected by a user, for instance, through a user device communicatively coupled (e.g. over a network) to the control entity. Each received identification signature can be mapped to a function to be performed within the selected application. As indicated, the identification signatures can be associated with different functions for different activities. In this manner, the function associated with the module can be determined based at least in part on the application selected by the user.

The instruction set can include a sequence of functions to be performed by the external device. The instruction set can be determined based at least in part on the selected activity. The instruction set can further be determined based at least in part on the configuration and/or layout of the modular components within the modular chain. For instance, the control entity can determine an order of execution of the various functions to be performed based at least in part on an execution model associated with the configuration and/or layout of the modular chain. For instance, the execution model associated with a linear chain can specify a linear order of execution such that the instructions are read sequentially according to the proximity of the corresponding modular component-module pairs to the control entity. As another example, the execution model can specify that the instructions from each modular component-module pair be read simultaneously. When the modular chain includes a multi-dimensional configuration (e.g. a square arrangement of 4×4), an execution model can specify that the instructions be read one at a time, in parallel rows, parallel columns, simultaneously, or in other suitable orders.

The control entity can provide the instruction set to an external device associated with the selected application for performance of the instruction set by the external device. In some implementations, the external device can be can be any suitable computing device, such as a smartphone, tablet, laptop, desktop, PDA, mobile phone, display with one or more processors, wearable computing device, or other suitable device. In some implementations, the external device can be a physical device, such as a robot device, lighting device, control surface, automotive device, or other suitable external device capable of being controlled by the modular computing environment. The external device can be communicatively coupled to the modular computing environment, for instance, through a network (e.g. Wi-Fi network, Bluetooth network, and/or other suitable network). In some implementations, the user device can present a user interface to the user specifying one or more applications to which the control entity can connect. For instance, the activities can be associated with one or more external devices currently connected to the network. Upon a user selection of an application, data indicative of the selected application can be communicated to the control entity, and the control entity can determine an instruction set to be performed in the context of the selected application.

According to example aspects of the present disclosure, the modular computing environment can be reconfigurable, such that one or more modular component-module pairs associated with the modular chain of modular component-module pairs directly or indirectly coupled to the control entity can be rearranged, removed, replaced, manipulated, controlled, to facilitate the provision of desired control commands to an external device by the control entity. In this manner, the user can configure the modular chain in a desired arrangement to facilitate performance of a desired sequence of instructions in the context of a selected activity.

According to additional or alternative example aspects of the present disclosure, a feedback control scheme can be determined and implemented using a feedback control system. The feedback control system can be a haptic feedback control system including one or more haptic motors. The one or more haptic motors can be associated with an input mechanism configured to receive an input from a user. For instance, the input mechanism can be a dial, such as a rotatable dial, a button, a slider device, a fader device, a switch, a toggle device, or other suitable input mechanism configured to be actuated by a user. In some implementations, the input mechanism can be a free flowing input mechanism that does not have physical detents associated with the mechanical structure of the input mechanism. The feedback control system can be configured to determine a position or state of the input mechanism. For instance, the feedback control system can be configured to determine an angular position of a dial, a state of a switch, toggle, or button, a position along a track of a fader or slider device, etc.

In some implementations, the feedback control system can include one or more position sensors, such as one or more one or more Hall-effect sensors, magnetometers, rotary position sensors, or other suitable position sensors. The position sensor(s) can determine position data associated with the moveable portion of the input mechanism. In this manner, as the user actuates the input mechanism, the position sensor(s) can track the motion of the moveable portion of the input mechanism to determine an angular position, state, position along a track, etc. associated with the input mechanism.

In some implementations, the position sensor(s) can be configured to determine the position associated with the input mechanism based at least in part on a position of a magnet embedded within or otherwise attached to the moveable portion of the input mechanism. The magnet can move in a corresponding manner to the actuation of the input mechanism by the user. The position of the magnet (and therefrom the input mechanism) can be determined by variations in a magnetic field and/or a polarity associated with the magnet caused by the movement of the magnet.

A feedback scheme can be determined for the input mechanism. The feedback scheme can specify one or more feedback points associated with the position of the input mechanism at which feedback is to be applied using, for instance, the haptic motor. As an example, when the input mechanism is a rotatable dial, the feedback scheme can specify feedback points at one or more angular positions associated with the rotational movement of the dial at which feedback is to be applied. As another example, when the input mechanism is a slider or fader device configured to be actuated along a track, the feedback scheme can specify feedback points at one or more positions with respect to the track at which feedback is to be applied. As yet another example, when the input mechanism is a switch, toggle, button, etc. having multiple states, the feedback scheme can specify feedback points at positions of the input mechanism corresponding to one or more of the states. In some implementations, the feedback scheme can specify that feedback is to be applied in response to each state change of the input mechanism.

In some implementations, the feedback scheme can further specify a type and/or intensity of feedback to be applied. For instance, the feedback scheme can specify that lighting feedback, audio feedback, vibratory feedback, or other feedback type is to be applied at one or more of the feedback points. The feedback scheme can further specify an intensity of feedback, such as a volume associated with audio feedback, a vibration intensity, length, pattern etc. associated with vibratory feedback, a luminosity, color, pattern, etc. associated with lighting feedback, etc. The type and/or intensity of feedback can vary at different feedback points. For instance, the feedback scheme can specify that lighting feedback is to be applied at a first feedback point, and that vibratory feedback is to be applied at a second feedback point. As another example, the feedback scheme can specify that feedback having a first intensity level is to be applied at a first feedback point, and that feedback having a second intensity level is to be applied a second feedback point.

In some implementations, the feedback points in a feedback scheme can be associated with one or more settings of an application or activity associated with the input mechanism. For instance, the input mechanism can be configured to control operation of one or more applications associated with one or more devices. As an example, a rotatable dial can be configured to control operation of a lighting element having multiple discrete light intensity settings (e.g. dim, medium, bright, very bright, etc.). The dial can be configured to include multiple setting points, each corresponding to a light intensity setting. The setting points can be positioned at various angular positions associated with the dial. In some implementations, the setting points can be evenly spaced around the rotatable spectrum of the dial. The lighting element can operate in accordance with the various light intensity settings as a user actuates the dial to the various setting points. In this manner, the feedback control scheme can include feedback points corresponding to each light intensity setting. For instance, the feedback points can be positioned at multiple angular positions of the dial corresponding to a change in light intensity setting (e.g. to the various setting points). As another example, the dial can control a frequency of a radio device that is able to pick up multiple discrete radio stations. The user can then actuate the dial to various setting points associated with the radio stations to change the reception frequency of the radio device to tune in to a particular radio station. A feedback scheme associated with the input mechanism can specify feedback points corresponding to the various setting points, such that when the user actuates the dial, feedback can be applied each time the radio tunes into a different radio station.

In some implementations, the feedback scheme can be reprogrammed based at least in part on a variable number of settings or inputs associated with the application. For instance, in continuing the radio control example from above, if the radio picks up an additional radio station signal, an additional setting point can be added for the additional radio station. The feedback scheme can then be reprogrammed to include an additional feedback point associated with the additional setting point and/or radio station. For instance, the setting points and feedback points can be reapportioned along the rotational spectrum of the dial to include the additional radio station.

In this manner, a particular input mechanism can be configured to control multiple applications. One or more of the applications can be associated with different feedback schemes. The feedback schemes can be defined for a particular input mechanism and/or a particular application. In this manner, while operating in a particular application, the feedback control system can control operation of a feedback motor in accordance with the feedback scheme determined for the application. In this manner, upon a user interaction with the input mechanism, the feedback motor can be controlled to provide feedback to the user in accordance with the feedback scheme as the user moves the input mechanism to the various feedback points.

With reference now to the figures, example aspects of the present disclosure will be described in greater detail. For instance, FIG. 1 depicts an overview of an example modular computing environment 100 according to example embodiments of the present disclosure. Environment 100 includes a control entity 102 in communication with one or more modular components 104. The modular components 104 can directly or indirectly couple to control entity 102 to form a modular chain. For instance, a first modular component 104 can be directly coupled to control entity 102, for instance, through physical contact with control entity 102. One or more additional modular components 104 can be indirectly coupled to control entity 102, for instance, through physical contact with the first modular component 104 and/or one or more additional modular components 104. In this manner, the modular components can form a modular chain having a mesh communication structure wherein data flows to and from the control entity 102 by way of the modular chain.

Each modular component can be configured to receive a module 106, for instance as desired by a user. The module 106 can encode a function, command, or instruction to be performed within an application within an identification signature of the module 106. In this manner, the module 106 can be a tile-like structure configured to fit within, attach or mount to, or otherwise make contact with a modular component 104. As indicated above, module 106 can be a static module or a dynamic module. In this manner, the module 106 and the modular component 104 can form a modular component-module pair. The user can form modular component-module pairs and arrange them as desired to facilitate performance of a desired instruction set within the framework of a specified application.

Modular component 104 can further include a state data generator 108. State data generator 108 can be configured determine state data associated with the modular component-module pair. For instance, the state data can include the identification signature of the module 106. The state data can further include data indicative of a configuration context of the modular component-module pair. In this manner, state data generator 108 can further be configured to determine the configuration context of the modular component 104 within the modular chain. For instance, each modular component 104 within the modular chain associated with control entity 102 can communicate among each other to determine the respective configuration contexts of the modular components 104. The configuration context can refer to a position of the modular component 104 within the modular chain. The state data can further include position data associated with an input mechanism of module 106 (e.g. when module 106 is a dynamic module). The position data can be determined based at least in part on a position of the input mechanism within the framework of the track, spectrum, state, etc. of a moveable portion of the input mechanism. For instance, the position of the input mechanism can be determined using one or more position sensors 110 associated with the modular component 104. As indicated above, the position sensor(s) can include or otherwise be associated with one or more Hall-effect sensors, rotary position sensors, magnetometers, or other suitable position sensors. For instance, in some implementations, the position sensors can determine position data associated with a magnet embedded within or otherwise associated with the input mechanism. The position data can include angular position data (e.g. for a knob or dial), state data (e.g. for a switch, button, or toggle), data indicative of a position along a track (e.g. for a fader or slider), or other suitable position data.

As will be described in more detail below, modular component 104 can further include a feedback control 112. Feedback control 112 can include one or more output devices, such as a lighting component, a feedback motor, or other output device configured to provide feedback to a user. In some implementations, the feedback control 112 can provide feedback in accordance with one or more control commands provided by the control entity 102. In some implementations, the control entity 102 can assign some autonomy to the feedback control 112. For instance, the control entity 102 can assign control of the feedback motor or lighting elements to the feedback control 112 in accordance with a program associated with the module 106.

Each modular component 104 in the modular chain associated with the control entity 102 can provide the determined state data to the control entity, for instance, responsive to a request from control entity 102. In this manner, the state data may be communicated by way of the modular chain, such that the modular components 104 that are indirectly coupled to the control entity 102 (e.g. that do not make direct contact with the control entity 102) can provide the sate data to the control entity 102 by way of at least one additional modular component 104.

Control entity 102 can include an instruction generator 120 configured to generate an instruction set to be performed within the context of a specified application based at least in part on the received state data. For instance, control entity 102 can access application data 114 to determine functions associated with the specified application that correspond to the identification signatures provided within the state data. Control entity 102 can further access application data 114 to determine one or more application control values associated with the application functions that correspond to the position data provided within the state data. As indicated, the control values can be used as arguments within the corresponding application function.

As indicated, an identification signature associated with a particular module can correspond to different functions for different applications. For instance, a particular identification signature may correspond to a control command of "turn right" in an application associated with controlling a vehicle, and to a control command of "jump" in an application associated with control of a robot device. In this manner, a list of functions associated with an application can be mapped to corresponding identification signatures and stored in one or more databases associated with application data 114. In some implementations, an identification signature associated with a particular module can be assigned to multiple functions within a particular activity. For instance, a module can be reused within a particular activity if the module is reassigned to a different function within the activity.

Control entity 102 can further be in communication with a user device 116 and/or a physical device 118, for instance, via a network. The user device 116 can present a user interface to the user to facilitate a selection of an application by the user. For instance, the control entity can identify one or more available external devices (e.g. user device 116, physical device 118 and/or other external device) connected to the network and capable of receiving control commands from control entity 102 for the performance of an application. Control entity 102 can further determine one or more available applications based at least in part on the available devices. For instance, the available applications can be applications that the available devices are capable of implementing. Control entity 102 can provide data indicative of the available applications to the user device 116, which can present the available applications to the user within the user interface. The user can select an application, and data indicative of the selection can be provided to the control entity 102. In this manner, upon receiving the data indicative of the selected application, instruction generator 120 can access application data 114 to determine the function data for the selected application.

As indicated above, the sequencing of the instruction set can be determined in accordance with an execution model associated with the control entity 102. The execution model can specify an order in which the functions within the instruction set are to be executed. In particular, the execution model can specify the order based on the arrangement and/or configuration of the modular chain of modular components 214. For instance, the execution model can be a linear execution model that specifies an order of execution of the functions based on proximity of the modular component-module pairs to the control entity 102. As another example, the execution model can specify an order of execution of the functions based on a row or column in which the corresponding modular component-module pairs are located within the modular chain.

Once the instruction set has been generated, control entity 102 can provide the instruction set to an appropriate device (e.g. user device 116, physical device 118, or other external device). Each application can correspond to a particular device. In this manner, the instruction set can be provided to the external device corresponding to the selected application. Upon receiving the instruction set, the external device can execute the instructions to implement the application.

In some implementations, updated state data can be provided by one or more modular components 104 to control entity 102, for instance, during the performance of the activity. The updated state data can reflect a user interaction with the input mechanism of a module 106. More particularly, the updated state data can include updated position data indicative of a new position of the input mechanism. Upon receiving the updated state data, the control entity 102 can access application data 114 to determine a control value corresponding to the position data. The control entity 102 can then provide data indicative of the control value to the appropriate external device, such that the external device can operate in accordance with the control value.

Figure 2:
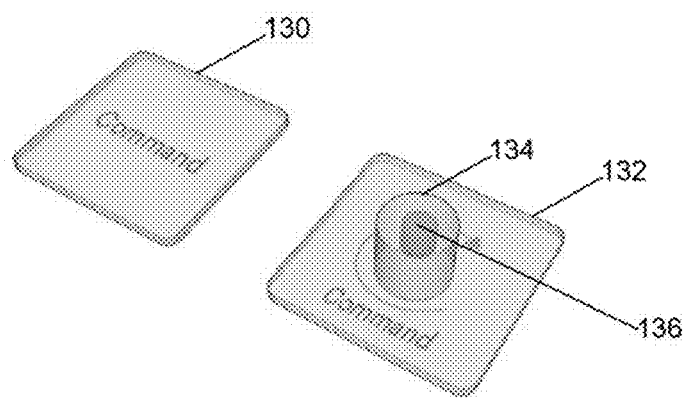
FIG. 2 depicts example modules according to example embodiments of the present disclosure.

FIG. 2 depicts example modules 130 and 132 according to example embodiments of the present disclosure. Module 130 represents a static module and module 132 represents a dynamic module. As indicated, the modules 130, 132 can be tile-like structures configured to attach to or otherwise make contact with a modular component. The modules 130, 132 can encode a command, function, or instruction within an identification signature of the module. In implementations wherein the identification signature is a capacitive signature, the modules 132, 132 can be made from various suitable non-capacitive materials, such as paper, card, wood, plastic, or other suitable non-capacitive material.

As indicated above, the static module 130 can be associated with an invariable, constant function that does not change within the context of a particular application. The dynamic module 132 can be associated with a variable function that can be determined based at least in part on a user interaction with an input mechanism, such as a rotatable dial 134 associated with the dynamic module 132. As indicated, although FIG. 2 depicts a dial, the input mechanism can be any suitable input mechanism capable of being actuated by a user, such as a knob, button, switch, toggle, fader, etc. The dial 134 can further be fitted with a magnet 136, for instance, within a moveable portion of the dial 134. In this manner, the magnet 136 can be fitted within the dial 134 such that, when the dial 134 is rotated by the user, the magnet 136 is rotated in a corresponding manner. In this regard, the position and/or orientation of the magnet 136 can represent the position and/or orientation of the dial 134.

As indicated above, modules 130, 132 can be configured to encode unique identification signatures that respectively represent the modules. The identification signatures can be encoded using various suitable techniques, such as radio-frequency identification (RFID) techniques (e.g. passive RFID), bar code techniques (e.g. 2-D bar codes), near field communication (NFC) technologies, capacitive sensing techniques, and/or other suitable identification techniques. For instance, in some implementations, the identification signature can be a capacitive signature represented by a particular pattern of capacitive materials attached to a surface of the module configured to come in contact with a modular component.

Figure 3:
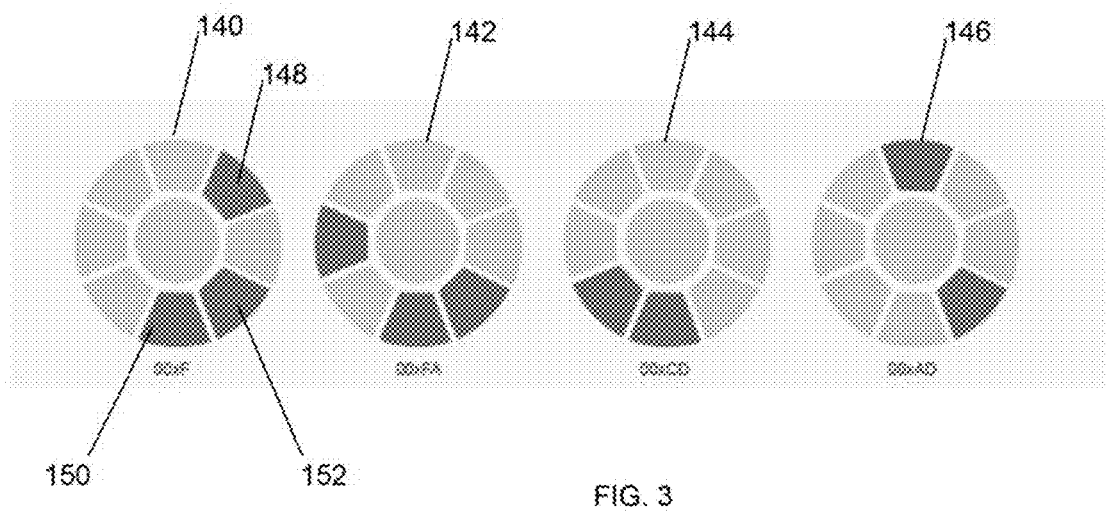
FIG. 3 depicts example identification signatures associated with one or more modules according to example embodiments of the present disclosure.

For instance, FIG. 3 depicts an example capacitive identification signature scheme that can be used according to example embodiments of the present disclosure. In particular, FIG. 3 depicts capacitive signature representations 140, 142, 144, and 146. Each capacitive signature representation can be positioned on a surface of a module. The capacitive signature representations can include a predefined pattern of capacitive pads that correspond to a capacitive signature of a module. For instance, capacitive signature representation 140 includes capacitive pads 148, 150, and 152. The capacitive pads can be made from various suitable conductive materials, such as capacitive ink, conductive thread, conductive tape, metal, PCB, etc. The predefined pattern can represent, for instance, an 8-bit hexadecimal capacitive signature that represents an particular module. In this manner, different arrangements or patterns of the capacitive pads can represent different capacitive signatures. The patterns can be configured based at least in part on a capacitive sensor associated with a modular component. The capacitive sensor can be configured to read the capacitive signature of a module when the capacitive signature is brought into contact with the capacitive sensor.

Figure 4:
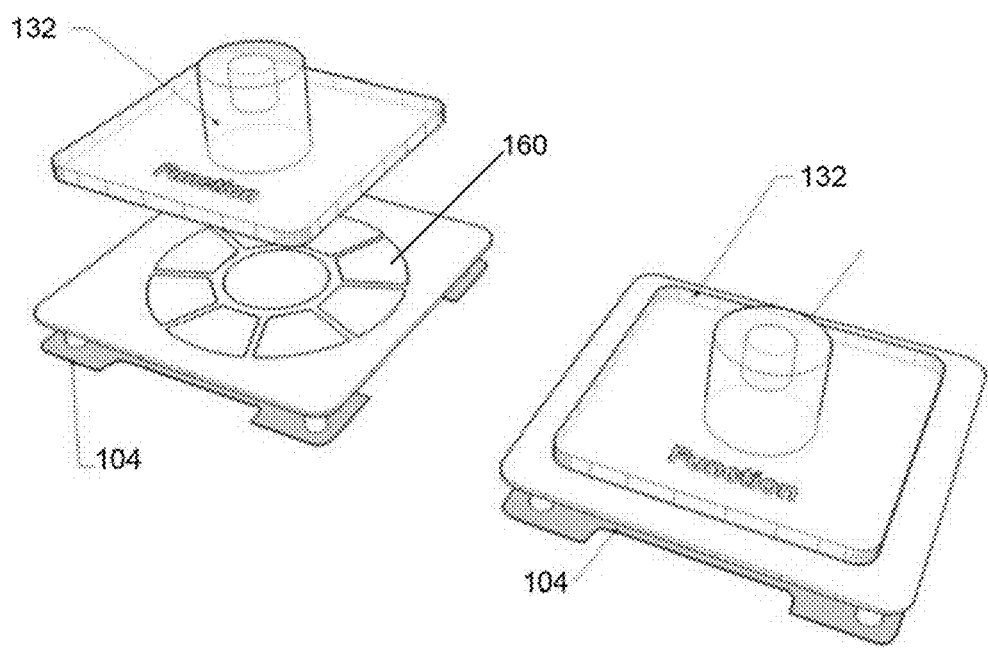
FIG. 4 depicts an example interaction between a module and a modular component according to example embodiments of the present disclosure.

FIG. 4 depicts an example interaction between a module 132 and a modular component 104. As indicated, a user can pair modular component 104 and module 132 to form a modular component-module pair, for instance, by bringing module 132 into contact with modular component 104. As shown, modular component 104 includes a capacitive sensor 160. Capacitive sensor 160 can be configured to read the capacitive signature positioned on the bottom surface of module 132 when the module is placed on modular component 104. In particular, capacitive sensor 160 can be configured to determine the pattern of the capacitive pads associated with the module 132. The pattern can then be mapped to a corresponding capacitive signature.

As indicated above, one or more modular components 104 can be linked together to form a modular chain associated with the control entity 102. The modular components 104 within a modular chain can be arranged in various manners by a user. The control entity 102 can then determine an order of execution of instructions associated with the modular components 104 based at least in part on the arrangement of the modular components 104. In particular, the control entity 102 can determine the order of execution based at least in part on an execution model associated with the control entity 102. The execution model can specify a protocol for determining the order of execution.

Figure 5:
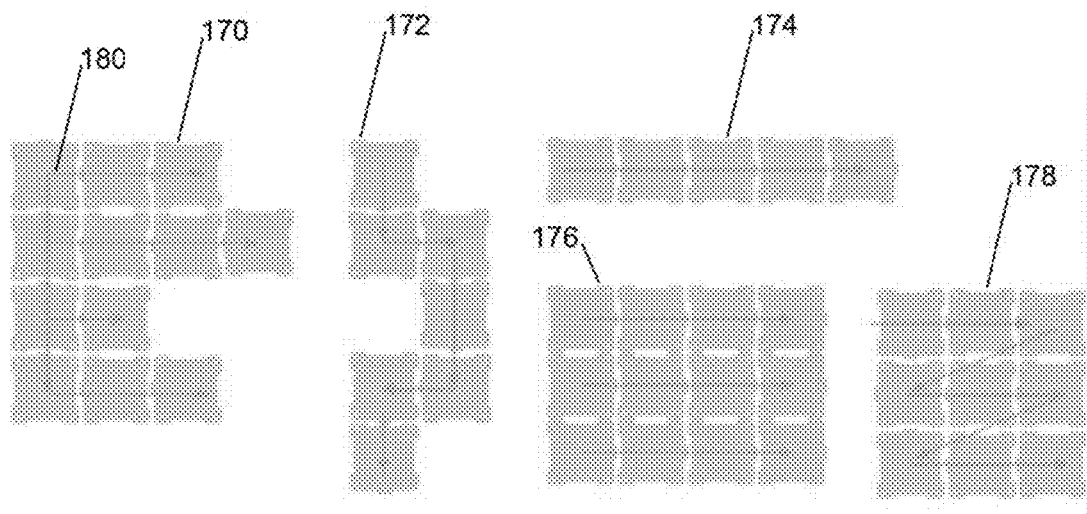
FIG. 5 depicts example modular chains and example execution model representations according to example embodiments of the present disclosure.

For instance, FIG. 5 depicts various example modular chains and ordering protocols associated with modular chains. In particular, FIG. 5 depicts modular chains 170, 172, 174, 176, and 178. As shown, modular chains 170-178 include multiple modular components 104 arranged in various manners by the user. The arrows 180 depicted within the modular chains 170-178 represent example execution models that can be used to determine an execution order of instructions associated with the modular components 104 within the modular chains 170-178.

In this manner, the interpretation of the modular chains 170-178 can be set programmatically in the control entity 102. For instance, the modular chain 170 can be interpreted on a row-by-row basis starting from the top row to the bottom row. Modular chain 172 can be interpreted in a linear manner starting with the modular component 104 closest to the control entity 104. The order of execution can be used by the control entity in generating the instruction set. For instance, the instruction set can be configured such that functions associated with each modular component in a modular chain are executed by an external device according to the order of execution specified by the execution model and the arrangement of the modular components 104 within the modular chain.

Although FIG. 5 depicts the formation of the modular chains 170-178 through a physical connection between the modular chains, it will be appreciated that the modular chains of the present disclosure can be formed through other communication techniques. For instance, a modular chain can be formed using wireless communication techniques in which a physical connection is not required between the modular components 104 to form a modular chain. In addition, the modular chain may also communicate with a control entity through wireless communication techniques. In this manner, communication of state data by the modular components 104 of a modular chain to the control entity can be performed, for instance, using a wireless mesh type technique wherein the state data associated with a particular modular component can be wirelessly routed to one or more additional modular components within the modular chain and subsequently communicated to the control entity 102. However, it will also be appreciated that non-mesh wireless communication techniques can also be used wherein each modular component 104 within a modular chain communicates state data directly to the control entity 102 using wireless communication techniques.

Figure 6:
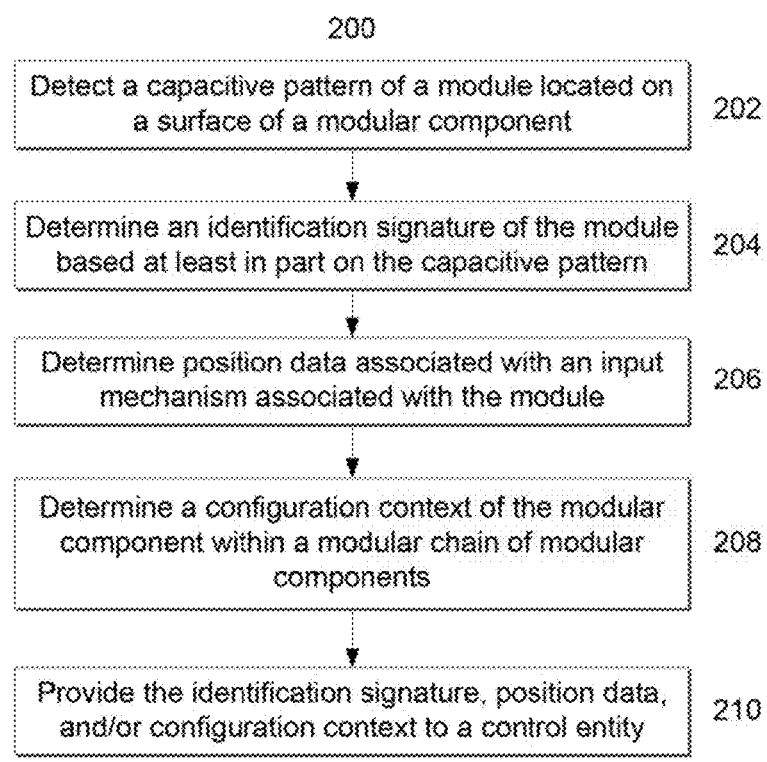
FIG. 6 depicts a flow diagram of an example method for determining state data according to example embodiments of the present disclosure.

FIG. 6 depicts a flow diagram of an example method (200) of providing state data to a control entity according to example embodiments of the present disclosure. Method (200) can be implemented by one or more computing devices, such as one or more of the computing devices depicted in FIG. 11. In particular implementations, the method (200) can be implemented by a modular component 104 depicted in FIG. 1. In addition, FIG. 6 depicts steps performed in a particular order for purposes of illustration and discussion. Those of ordinary skill in the art, using the disclosures provided herein, will understand that the steps of any of the methods discussed herein can be adapted, rearranged, expanded, omitted, or modified in various ways without deviating from the scope of the present disclosure.

At (202), method (200) can include detecting a capacitive pattern associated with a module positioned on a surface of a modular component. As indicated, the capacitive pattern can represent an identification signature of the module. The capacitive pattern can be formed using one or more capacitive pads arranged in a predefined pattern such that the pattern can be read by a capacitive sensor associated with a modular component when the capacitive pattern is positioned proximate the capacitive sensor. In this manner, when the module is positioned proximate the modular component, the capacitive sensor can detect the pattern using various suitable capacitive sensing techniques.

At (204), method (200) can include determining an identification signature of the module based at least in part on the capacitive pattern. For instance, the identification signature can be an 8-bit hexadecimal identification signature that corresponds to the particular pattern of the module. It will be appreciated that various other suitable identification signature formats can be used without deviating from the scope of the present disclosure. The pattern can be mapped to a corresponding identification signature, for instance by accessing a lookup table or other structure that maps identification signatures to capacitive patterns.

It will be appreciated that various other suitable identification signatures can be used, and that the identification signatures can be determined using various other suitable identification techniques. For instance, the identification signature can be encoded within a passive RFID tag associated with the module. In this manner, the modular component can include an RFID reader, such that the RFID reader can extract the identification signature from the RFIE tag when the module is positioned proximate the modular component.

At (206), method (200) can include determining position data associated with an input mechanism associated with the module. As indicated, one or more modules can include input mechanisms capable of being actuated by a user. The position, state, and/or orientation of a moveable portion of the input mechanism can be determined by the modular component, for instance, using one or more position sensors, such as one or more magnetometers, Hall-effect sensors, rotary position sensors, etc. For instance, the position data can be associated with a position along a track or rotational spectrum defining a range in which the input mechanism can be actuated. In some implementations, the position data can be associated with a state (e.g. of a switch or toggle).

At (208), method (200) can include determining a configuration context of the modular component within a modular chain of modular components directly or indirectly coupled to a control entity. For instance, the configuration context can refer to a position of the modular component with respect to the modular chain. In this manner, the modular component can communicate with one or more additional modular components within the modular chain to coordinate a determination of the configuration context by the modular component.

At (210), method (200) can include providing the identification signature, position data, and/or configuration context to the control entity. For instance, the modular component can generate a state data packet including data indicative of one or more of the identification signature, position data, or configuration context. As indicated, in some implementations, the state data packet can be routed through one or more additional modular components within the modular chain before reaching the control entity.

Figure 7:
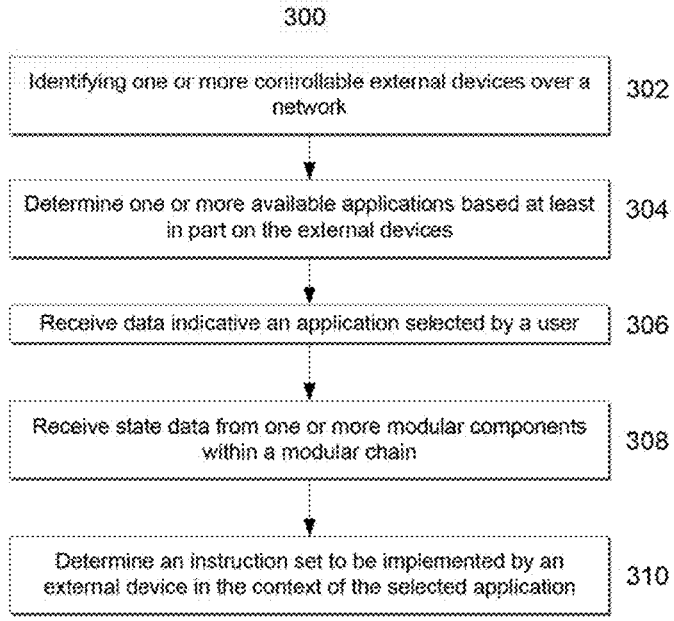
FIG. 7 depicts a flow diagram of an example method for determining an instruction set according to example embodiments of the present disclosure.

The state data packet can be used by the control entity to determine an instruction set associated with a selected application. For instance, FIG. 7 depicts a flow diagram of an example method (300) of determining an instruction set according to example embodiments of the present disclosure. Method (300) can be implemented by one or more computing devices, such as one or more of the computing devices depicted in FIG. 12. In particular implementations, the method (300) can be implemented by a control entity 102 depicted in FIG. 1. In addition, FIG. 7 depicts steps performed in a particular order for purposes of illustration and discussion. Those of ordinary skill in the art, using the disclosures provided herein, will understand that the steps of any of the methods discussed herein can be adapted, rearranged, expanded, omitted, or modified in various ways without deviating from the scope of the present disclosure.

At (302), method (300) can include identifying one or more controllable external devices over a network. For instance, the one or more controllable external devices can include one or more user computing devices and/or one or more physical devices (e.g. robot device, automobile, light switch, radio device, etc.). The controllable devices can be devices capable of performing applications associated with the control entity and/or capable of implementing control commands provided by the control entity for use in implementation of an application associated with the control entity.

At (304), method (300) can include determining one or more available application based at least in part on the presence of the external devices. For instance, the available applications can include one or more applications that the external devices present on the network are capable of implementing. For instance, the applications can include control applications associated with an automobile, robot device, user device, light switch radio, etc. The applications can be associated with various aspects of control of the present external devices.

At (306), method (300) can include receiving data indicative of an application selected by a user. For instance, the available applications can be provided to the user device for display by the user device in a user interface. The user of the user device can select an application through interaction with the user interface. Data indicative of the selected action can be provided to the control entity.

At (308), method (300) can include receiving state data from one or more modular components in a modular chain of modular components directly or indirectly coupled to the control entity. At (310), method (300) can include determining an instruction set to be implemented by an external device associated with the selected application. The instruction set can be determined based at least in part on the state data. The instruction set can include one or more functions to be performed by the external device within the context of the selected application.

Figure 8:
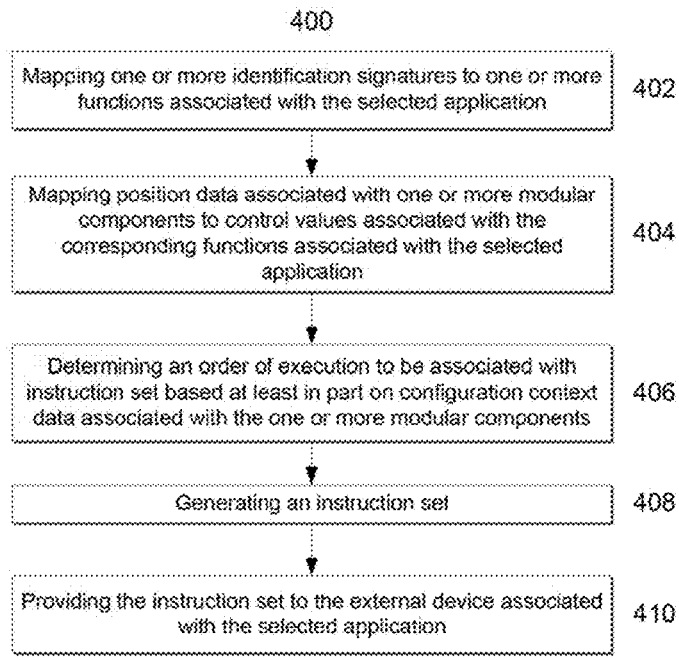
FIG. 8 depicts a flow diagram of an example method for determining an instruction set according to example embodiments of the present disclosure.

FIG. 8 depicts a flow diagram of an example method (400) of determining an instruction set according to example embodiments of the present disclosure. In some implementations, method (400) can correspond to (310) of method (300). Method (400) can be implemented by one or more computing devices, such as one or more of the computing devices depicted in FIG. 12. In particular implementations, the method (400) can be implemented by a control entity 102 depicted in FIG. 1. In addition, FIG. 8 depicts steps performed in a particular order for purposes of illustration and discussion. Those of ordinary skill in the art, using the disclosures provided herein, will understand that the steps of any of the methods discussed herein can be adapted, rearranged, expanded, omitted, or modified in various ways without deviating from the scope of the present disclosure.

At (402), method (400) can include mapping one or more identification signatures associated with one or more modular components within a modular chain to one or more functions associated with the selected application. For instance the identification signatures can be mapped to the corresponding functions by accessing a lookup table that correlates identification signatures to functions within an application.

At (404), method (400) can include mapping position data associated with the one or more modular components to control values associated with the corresponding functions associated with the selected application. For instance, a control value can specify an argument to the corresponding function associated with a modular component.

At (406), method (400) can include determining an order of execution to be associated with the instruction set based at least in part on the configuration context data associated with the one or more modular components. As indicated, the configuration context data can indicate respective positions of the modular components within the modular chain. In this manner, the collective configuration context data can be used to determine an arrangement and/or configuration of the modular chain. The order of execution can be determined in accordance with an execution model that specifies rules and/or protocols for the order in which the instructions are to be executed.

At (408), method (400) can include generating an instruction set based at least in part on the mapped functions, mapped control values, and determined order of execution. At (410), method (400) can include providing the instruction set to the external device associated with the selected application.

As indicated, additional aspects of the present disclosure are directed to providing feedback control associated with an input mechanism capable of being actuated by a user. In some implementations, such feedback control can be integrated within the modular computing environment of the present disclosure. In some implementations, the feedback control of the present disclosure can be implemented within one or more alternative control interfaces. In this manner, the feedback control of the present disclosure can be implemented within any suitable system, aspects of which include providing feedback to a user.

Figure 9:
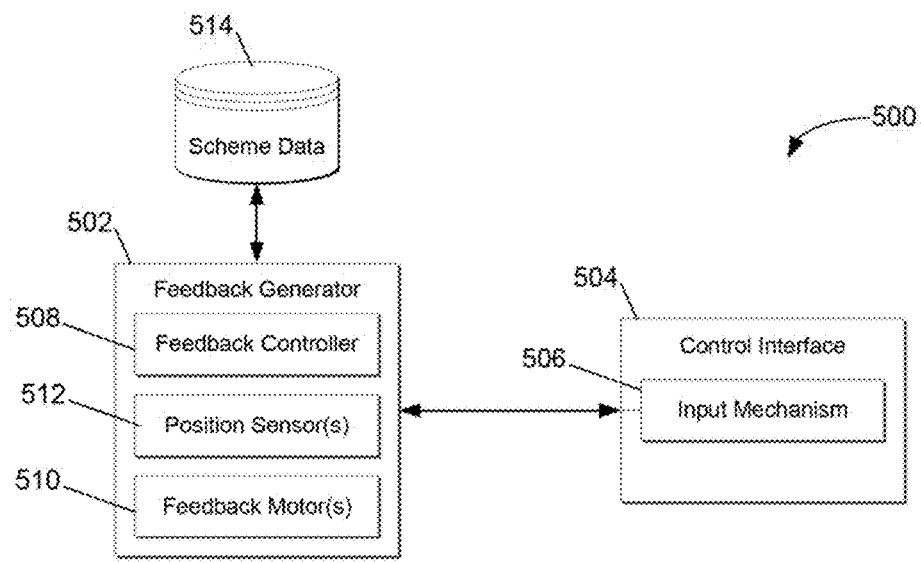
FIG. 9 depicts an example system for providing feedback control according to example embodiments of the present disclosure.

For instance, FIG. 9 depicts an overview of an example system 500 for providing feedback to a user according to example embodiments of the present disclosure. System 500 includes a feedback generator 502 that interfaces with a control interface 504. The control interface 504 can include an input mechanism 506. In some implementations, the input mechanism 506 can be capable of being actuated by a user. For instance, the input mechanism 506 can be a knob, dial, button, toggle, switch, slider, fader, or other suitable input mechanism. The input mechanism 506 can be a free flowing input mechanism that does not include any physical detents in the mechanical structure of the input mechanism 506. In this manner, the user can interact with the input mechanism 506 to change a position and/or orientation of the input mechanism to control an application associated with the control interface.

Feedback generator 502 includes a feedback controller 508. Feedback controller 508 can include one or more processors and one or more memory devices including computer-readable instructions that can be executed by the one or more processors to perform operations according to example embodiments of the present disclosure. Feedback controller 508 can be configured to control operation of one or more feedback motors 510 to cause the feedback motor(s) 510 to provide feedback to a user. In some implementations, the feedback controller 508 can correspond to the feedback control 112 of FIG. 1. The feedback motor(s) can include any suitable device or component capable of providing feedback to a user. For instance, the feedback motor(s) 510 can include one or more lighting components, audio components, vibration motors, etc. In this manner, operation of the feedback motors 510 can be controlled to provide suitable feedback signals to a user, for instance, in response to an actuation of the input mechanism 506.

Feedback generator 502 further includes one or more position sensors 512. For instance, the one or more position sensors 512 can include any suitable device or component capable of determining a position and/or orientation of the input mechanism 506. In some implementations, the position sensor(s) 512 can include one or more Hall-effect sensors, magnetometers, rotary position sensors, and/or any other suitable position sensor.

The positions sensor(s) 512 can be configured to determine a position and/or orientation of a moveable portion of the input mechanism 506. For instance, the position and/or orientation can be determined with respect to a state of the input mechanism 506. As another example, the position and/or orientation can be determined with respect to a position of the input mechanism along a track, or an angular position of the input mechanism along a rotational spectrum on which the input mechanism is configured to rotate. It will be appreciated that any suitable position determining technique can be used to determine the position of the input mechanism 506 without deviating from the scope of the present disclosure. For instance, in some implementations, the position of the input mechanism 506 can be determined using mechanical techniques.

Feedback controller 508 can be configured to control operation of the feedback motor(s) 510 based at least in part on the determined position and/or orientation of the input mechanism 506. For instance, feedback controller 508 can be configured to access scheme data 514 to determine a feedback scheme to apply to the input mechanism 506. The feedback scheme can include one or more feedback points at which to apply feedback. The feedback points can correspond to positions of the input mechanism 506. In this manner, the feedback points can be selected such that feedback is applied to the input mechanism 506 when a user actuates the input mechanism 506 to the one or more feedback points.

The feedback scheme can be determined based at least in part on the type of input mechanism 506 (e.g. knob, dial, switch, etc.). For instance, the feedback scheme can be determined to include one or more feedback points at one or more positions along the rotational spectrum of a dial or knob. As another example, the feedback scheme can be determined to include one or more feedback points that correspond to operation of a switch in one or more states of the switch. As yet another example the feedback scheme can be determined to include one or more feedback points at one or more positions along a track associated with a fader or slider. In this manner, as the user actuates the input mechanism 506 to one or more positions, states, etc. that correspond to feedback points, feedback controller 508 can control operation of the feedback motor(s) 510 to provide feedback to the user in accordance with the feedback scheme.

The feedback scheme can further be determined based at least in part on a control application associated with the input mechanism 506. For instance, the amount of feedback points and/or the position of the feedback points in the feedback scheme can be determined based at least in part on one or more settings and/or input values associated with the control application. For instance, if the input mechanism 505 is configured to control the volume of an audio system, the feedback points can correspond to volume levels. In this manner, if the audio system includes 10 volume levels, the feedback scheme can include 10 feedback points positioned along a track, rotational spectrum, etc. associated with the input mechanism 506. As another example, if the input mechanism 506 is configured to control an air conditioner in a vehicle having 4 discrete power settings, the feedback scheme can include 4 feedback points positioned along a rotational spectrum, track, etc. associated with the input mechanism 506. The position of the feedback points can vary. For instance, in some implementations, the feedback points may be evenly spaced along the track or spectrum of the input mechanism 506. In some implementations, the feedback points can be unevenly spaced around the track or spectrum. For instance, in some implementations, the feedback points can be positioned to indicate a difference between a setting value and a previous setting value.

The feedback schemes can be applied to the input mechanism 506 based at least in part on a selected application associated with the input mechanism 506. In this manner, the input mechanism 506 can be associated with multiple applications. For instance, a user can select an application associated with the input mechanism 506 such that the input mechanism 506 can be configured to control one or more aspects of the application. Scheme data 514 can be accessed to determine the feedback scheme to apply based at least in part on the selected application.

In some implementations, the feedback scheme can specify a type of feedback to be applied. For instance, the feedback scheme can specify an application of lighting feedback, audio feedback, vibratory feedback, and/or various other suitable types of feedback. The feedback scheme can further associate different feedback types with different feedback points. For instance, the feedback scheme can specify a first feedback type at a first feedback point associated with the input mechanism 506 within a control application, and a second feedback type at a second feedback point associated with the input mechanism 506 within the control application.

In some implementations, the feedback scheme can control one or more characteristics of the feedback to be provided. For instance, the feedback scheme can specify an intensity of the feedback, a pattern of the feedback, a length of the feedback, a color of the feedback (e.g. for lighting feedback), a luminosity of the feedback (e.g. for lighting feedback) and/or other suitable characteristics of the feedback. The feedback scheme can further specify different feedback characteristics for different feedback points within a control application. For instance, the feedback scheme may specify a gradually increasing or decreasing vibratory intensity at the various feedback points as the user actuates the input mechanism 506. In this manner, the feedback scheme can specify a first feedback characteristic (e.g. color, intensity, luminosity, etc.) at a first feedback point and a second feedback characteristic at a second feedback point.

In some implementations, the feedback scheme can be reprogrammable to modify the feedback scheme. For instance, one or more feedback points can be added, removed, modified, manipulated, etc. based at least in part on variations of the control application. In this manner, the feedback type and/or characteristics can be modified as well, for instance, to accommodate changes to the control application (e.g. an addition or removal of settings, etc.).

In this manner, as the user actuates the input mechanism 506, feedback generator 502 can be configured to track a position and/or orientation of a moveable portion of the input mechanism 506, and to control operation of the feedback motor(s) 510 in accordance with a feedback scheme associated with the input mechanism 506 and a control application associated with the input mechanism 506. In particular, operation of the feedback motor(s) can be controlled to provide feedback in accordance with the feedback scheme as the moveable portion of the input mechanism 506 traverses the various feedback points.

Figure 10:
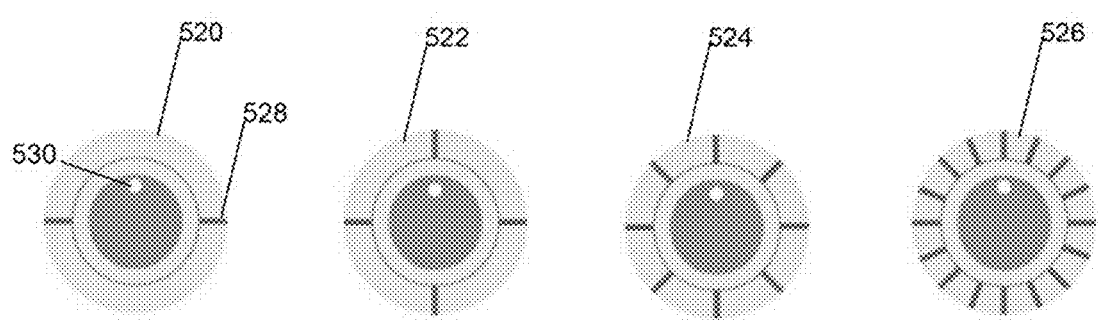
FIG. 10 depicts example feedback schemes associated with an input mechanism according to example embodiments of the present disclosure.

FIG. 10 depicts example feedback schemes 520, 522, 524, and 526 associated with input mechanism 506. As shown, FIG. 10 depicts the input mechanism 506 as a rotatable dial or knob. For instance, the example feedback schemes each include feedback points 528 associated with a spectrum 530 on which the input mechanism 506 is configured to rotate. In some implementations, the feedback points 528 can be specified as angular positions along the spectrum. For instance, feedback scheme 520 can include feedback points at 90 degrees and 270 degrees with respect to the rotational spectrum of the dial. In this manner, as the position indicator 530 is rotated to the 90 degree and 270 degree positions, feedback can be provided in accordance with the feedback scheme 520. As indicated, the feedback points 528 can correspond to settings or input values associated with one or more control applications. In this manner, the number of feedback points can be determined based at least in part on the control application (e.g. a number of settings associated with the control application).

Figure 11:
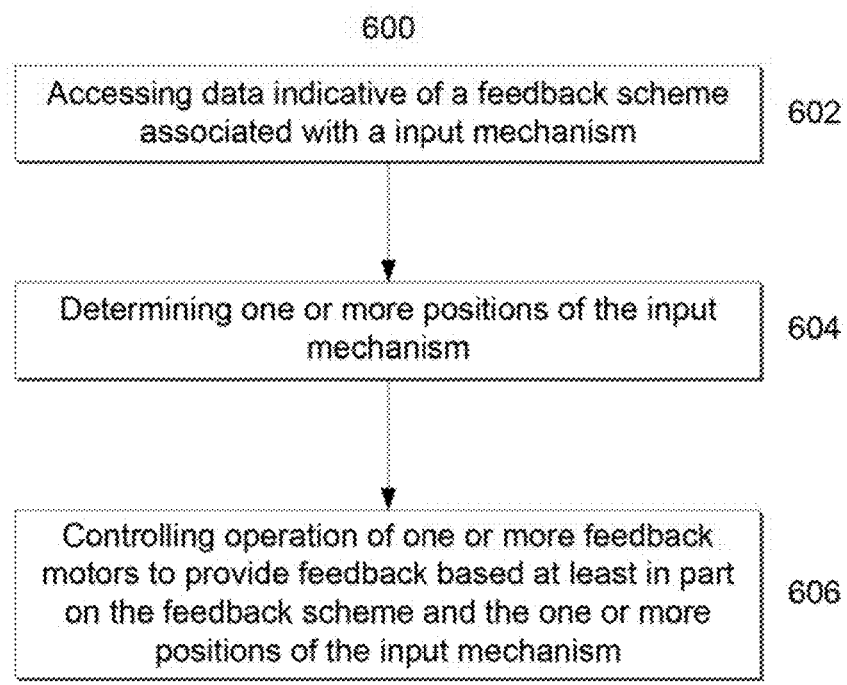
FIG. 11 depicts a flow diagram of an example method of providing feedback control according to example embodiments of the present disclosure.

FIG. 11 depicts a flow diagram of an example method (600) of providing feedback according to example embodiments of the present disclosure. Method (600) can be implemented by one or more computing devices, such as one or more of the computing devices depicted in FIG. 12. In particular implementations, the method (600) can be implemented by the system 500 depicted in FIG. 9. In addition, FIG. 11 depicts steps performed in a particular order for purposes of illustration and discussion. Those of ordinary skill in the art, using the disclosures provided herein, will understand that the steps of any of the methods discussed herein can be adapted, rearranged, expanded, omitted, or modified in various ways without deviating from the scope of the present disclosure.

At (602), method (600) can include accessing data indicative of a feedback scheme associated with an input mechanism. In particular, the feedback scheme can be associated with a control application associated with the input mechanism. The feedback scheme can specify one or more feedback points corresponding to one or more physical positions and/or orientations of a moveable portion of the input mechanism. The feedback scheme can further specify one or more types of feedback and/or one or more characteristics of the feedback to be applied at the one or more feedback points.

At (604), method (600) can include determining one or more positions of the input mechanism as the input mechanism is actuated along a track or spectrum by a user. For instance, the user can actuate the input mechanism to control one or more aspects of a device associated with the control application. As the user actuates the input mechanism, the position and/or orientation of the input mechanism can be tracked, for instance, by one or more positions sensors.

At (606), method (600) can include controlling operation of one or more feedback motors to provide feedback for the user based at least in part on the feedback scheme and the one or more determined positions of the input mechanism. In this manner, the feedback motor(s) can be controlled to provide vibration, lighting, audio signals, etc. as specified in the feedback scheme when the position of the input mechanism aligns with the feedback points.

Figure 12:
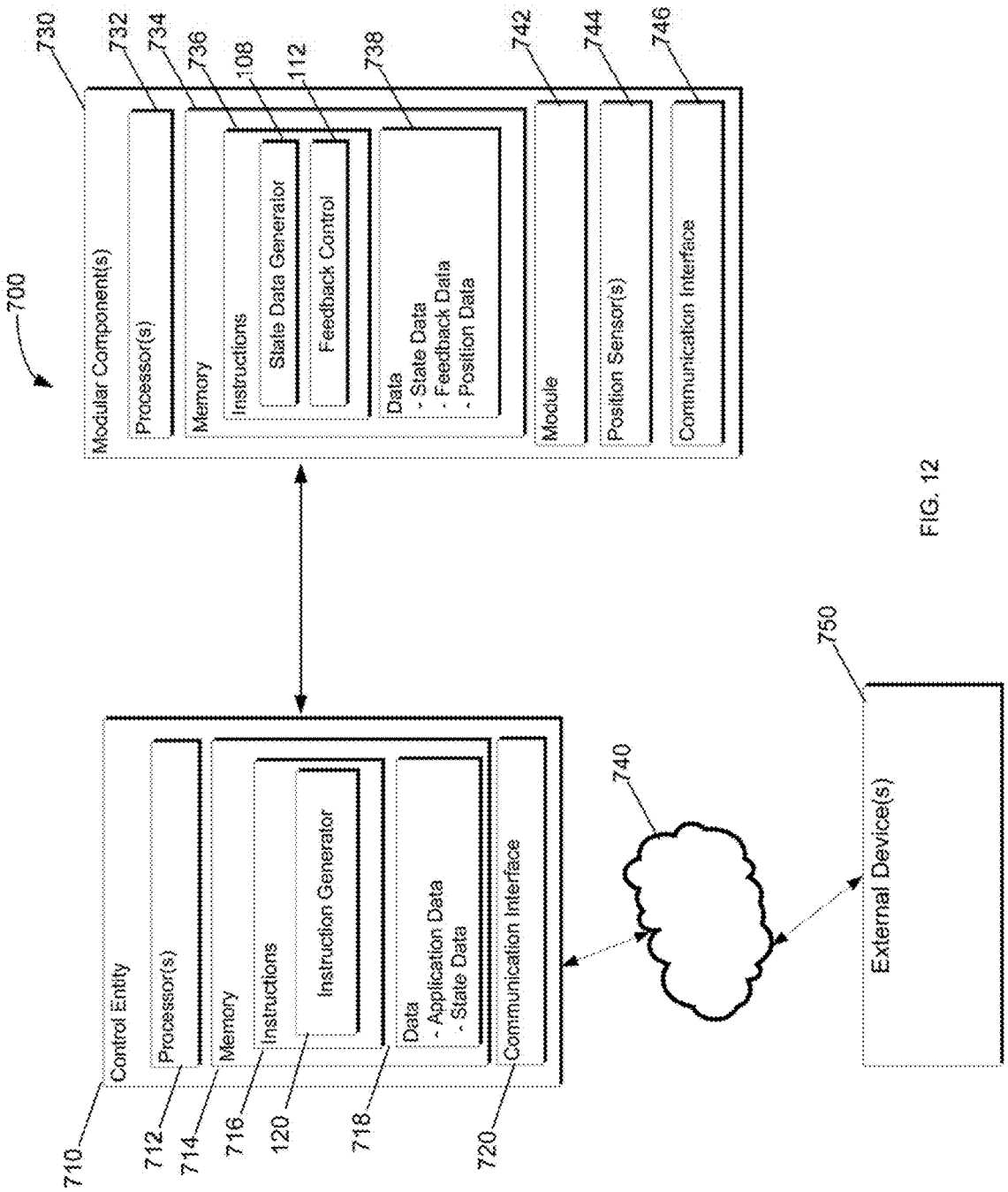
FIG. 12 depicts an example system according to example embodiments of the present disclosure.

FIG. 12 depicts an example computing system 700 that can be used to implement the methods and systems according to example aspects of the present disclosure. The system 700 can be implemented using a one or more computing devices that include a control entity 710 that communicates with one or more modular components 730, and one or more external devices 750 over a network 740. The system 700 can be implemented using other suitable architectures, such as a single computing device.

The system 700 includes a control entity 710. The control entity 710 can be implemented using any suitable computing device(s). The control entity 710 can have one or more processors 712 and one or more memory devices 714. The control entity 710 can also include a network interface used to communicate with one or more external devices 750 over the network 740. The network interface can include any suitable components for interfacing with one more networks, including for example, transmitters, receivers, ports, controllers, antennas, or other suitable components.

The one or more processors 712 can include any suitable processing device, such as a microprocessor, microcontroller, integrated circuit, logic device, or other suitable processing device. The one or more memory devices 714 can include one or more computer-readable media, including, but not limited to, non-transitory computer-readable media, RAM, ROM, hard drives, flash drives, or other memory devices. The one or more memory devices 714 can store information accessible by the one or more processors 712, including computer-readable instructions 716 that can be executed by the one or more processors 712. The instructions 716 can be any set of instructions that when executed by the one or more processors 712, cause the one or more processors 712 to perform operations. For instance, the instructions 716 can be executed by the one or more processors 712 to implement an instruction generator 120 described with reference to FIG. 1.

As shown in FIG. 12, the one or more memory devices 714 can also store data 718 that can be retrieved, manipulated, created, or stored by the one or more processors 712. The data 718 can include, for instance, application data, state data generated according to example aspects of the present disclosure, and other data. The data 718 can be stored locally on control entity 710, or in one or more databases. The one or more databases can be connected to the control entity 710 by a high bandwidth LAN or WAN, or can also be connected to control entity 710 through network 740. The one or more databases can be split up so that they are located in multiple locales.

The control entity 710 can also include a network interface used to communicate with one or more remote computing devices (e.g. external devices 750) over the network 740. The network interface can include any suitable components for interfacing with one more networks, including for example, transmitters, receivers, ports, controllers, antennas, or other suitable components.

The control entity 710 can also include a communication interface 720 used to communicate with one or more modular components 730 using various suitable communication techniques. In this manner, the communication interface 720 can communicatively couple the control entity 710 to one or more modular components 730 using one or more communication techniques, such as electrical, magnetic (e.g., inductive), or optical couplings, wireless, or other communication techniques (e.g. with a complementary communication interface 746 respectively associated with the modular component(s) 730). The communication interface 720 can include any suitable components for interfacing with the modular components 730, including for example, transmitters, receivers, ports, controllers, antennas, or other suitable components. As an example, the communication interface 720 can include a number of prongs, pins, contacts, or the like to form a number of serial data connections or other forms of data connection. In other implementations, the communication interface 720 can perform wireless communication with one or more of the modular components 730 (e.g., according to a short-range wireless communications protocol such as Bluetooth, or other wireless communication protocol, such as Wi-Fi).

The control entity 710 can exchange data with one or more modular components 730. Each of the modular components 730 can be can be implemented using any suitable computing device(s). Similar to the control entity 710, a modular component 730 can include one or more processor(s) 732 and a memory 734. The one or more processor(s) 732 can include one or more central processing units (CPUs), and/or other processing devices. The memory 734 can include one or more computer-readable media and can store information accessible by the one or more processors 732, including instructions 736 that can be executed by the one or more processors 732 and data 738. For instance, the memory 734 can store instructions 736 for implementing a state data generator 108 and a feedback control 112 described with reference to FIG. 1. The data 738 can include, for instance, feedback data, state data determined according to example embodiments of the present disclosure, position data determined according to example embodiments of the present disclosure, and other data.

The modular component 730 can be configured to receive a module 742. The module 742 can encode an identification signature associated with the module 742. The module can further include an input mechanism according to example embodiments of the present disclosure. The modular component 730 can further include one or more position sensor(s) 744 configured to determine a position and/or orientation of the input mechanism.

The modular component 730 can also include a communication interface 746 used to communicate with control entity 710 and/or one or more additional modular components 730 using various suitable communication techniques. In this manner, the communication interface 746 can communicatively couple the modular component 730 to the control entity 710 and/or to one or more additional modular components 730 using one or more communication techniques, such as electrical, magnetic (e.g., inductive), or optical couplings, wireless, or other communication techniques (e.g. with a complementary communication interface 720 or 746 respectively associated with the control entity 710 or the additional modular component(s) 730). The communication interface 746 can include any suitable components for interfacing with the control entity 710 and/or the additional modular components 730, including for example, transmitters, receivers, ports, controllers, antennas, or other suitable components. As an example, the communication interface 746 can include a number of prongs, pins, contacts, or the like to form a number of serial data connections or other forms of data connection. In other implementations, the communication interface 746 can perform wireless communication with the control entity 710 and/or the one or more additional modular components 730 (e.g., according to a short-range wireless communications protocol such as Bluetooth, or other wireless communication protocol, such as Wi-Fi).

The control entity 710 can communicate with one or more external computing devices 750 over network 740. The external device(s) 750 can include one or more user computing devices. The user computing device can be any suitable type of computing device, such as a general purpose computer, special purpose computer, laptop, desktop, mobile device, navigation system, smartphone, tablet, wearable computing device, a display with one or more processors, or other suitable computing device. The external device(s) 750 can further include one or more physical devices, such as one or more controllable robot devices, automobiles, light switches, and/or various other suitable devices capable of being controlled by the control entity 710.

The network 740 can be any type of communications network, such as a local area network (e.g. intranet), wide area network (e.g. Internet), cellular network, or some combination thereof. The network 740 can also include a direct connection between a modular component 730 and the control entity 710. In general, communication between the control entity 710 and a modular component 730 can be carried via network interface using any type of wired and/or wireless connection, using a variety of communication protocols (e.g. TCP/IP, HTTP, SMTP, FTP), encodings or formats (e.g. HTML, XML), and/or protection schemes (e.g. VPN, secure HTTP, SSL).

The technology discussed herein makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, server processes discussed herein may be implemented using a single server or multiple servers working in combination. Databases and applications may be implemented on a single system or distributed across multiple systems. Distributed components may operate sequentially or in parallel.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computer-implemented method of providing feedback control, the method comprising:
    accessing, by one or more processors, data indicative of a feedback scheme associated with an input mechanism, the feedback scheme specifying a feedback intensity level and comprising one or more feedback points associated with a position of a moveable portion of the input mechanism, the input mechanism being configured to change positions responsive to an actuation of the input mechanism by a user;
    determining, by the one or more processors, one or more positions of the moveable portion of the input mechanism as the input mechanism is actuated by the user; and
    controlling, by the one or more processors, operation of one or more feedback motors to provide feedback to the user in accordance with the feedback scheme based at least in part on the determined one or more positions of the input mechanism.

2. The computer-implemented method of claim 1, wherein the feedback scheme specifies a type of feedback to be provided at each of the one or more feedback points.

3. The computer-implemented method of claim 2, wherein the type of feedback comprises vibratory feedback, lighting feedback, or audio feedback.

4. The computer-implemented method of claim 1, wherein the feedback scheme specifies one or more characteristics associated with the feedback to be provided at each feedback point.

5. The computer-implemented method of claim 4, wherein the one or more characteristics comprise a luminosity, a volume, a color, a pattern, or a length of feedback.

6. The computer-implemented method of claim 1, wherein the one or more feedback points correspond to one or more settings associated with a control application associated with die input system.

7. The computer-implemented method of claim 6, wherein the feedback scheme is reprogrammable based at least in part on one or more variations of the control application.

8. The computer-implemented method of claim 1, wherein the input mechanism is a dial, button, slider, fader, switch, or toggle configured to be actuated by the user to provide an input to an input system.

9. The computer-implemented method of claim 8, wherein the, feedback scheme is determined based at least in part on an application to be performed by the input system.

10. The computer-implemented method of claim 1, wherein the one or more positions of the moveable portion of the input mechanism comprise one or more angular positions.

11. A haptic feedback system comprising:
    an input mechanism configured to change positions responsive to an actuation of the input mechanism by a user, the input mechanism configured to provide an input to an input system;
    one or more processors; and
    one or more memory devices, the one or more memory devices storing computer-readable instructions that when executed by the one or more processors cause the one or more processors to perform operations, the operations comprising:
        accessing data indicative of a feedback scheme associated with the input mechanism, the feedback scheme specifying a feedback intensity level and comprising one or more feedback points associated with a position of a moveable portion of the input mechanism;
        determining one or more positions of the moveable portion of the input mechanism as the input mechanism is actuated by the user; and
        controlling operation of one or more feedback motors to provide feedback to the user in accordance with the feedback scheme based at least in part on the determined one or more positions of the input mechanism.

12. The haptic feedback system of claim 11, wherein the feedback scheme specifies a type of feedback to be provided at each of the one or more feedback points.

13. The haptic feedback system of claim 12, wherein the type of feedback comprises vibratory feedback, lighting feedback, or audio feedback.

14. The haptic feedback system of claim 11, wherein the feedback scheme specifies one or more characteristics associated with the feedback to be provided at each feedback point.

15. The haptic feedback system of claim 14, wherein, the one or more characteristics comprise an intensity level, a luminosity, a volume, a color, a pattern, or a length of feedback.

16. The haptic feedback system of claim 11, wherein the one or more feedback points correspond to one or more settings associated with a control application associated with the input system.

17. One or more tangible, non-transitory computer-readable media storing computer-readable instructions that when executed by one or more processors cause the one or more processors to perform operations, the operations comprising:
   accessing data indicative of a feedback scheme associated with an input mechanism, the feedback scheme specifying a feedback intensity level and comprising one or more feedback points associated with a position of a moveable portion of the input mechanism, the input mechanism being configured to change positions responsive to an actuation of the input mechanism by a user;
   determining one or more positions of the moveable portion of the input mechanism as the input mechanism is actuated by the user; and
   controlling operation of one or more feedback motors to provide feedback to the user in accordance with the feedback scheme based at least in part on the determined one or more positions of the input mechanism.

18. The one or more tangible, non-transitory computer-readable media of claim 17, wherein the input mechanism is a dial, button, slider, fader, switch, or toggle configured to be actuated by the user to provide an input to an input system.

19. The one or more tangible, non-transitory computer-readable media of claim 18, wherein the feedback scheme is determined based at least in part on an application to be performed by the input system.

20. The one or more tangible, non-transitory computer-readable media of claim 17, wherein the feedback scheme specifies a type of feedback to be provided at each of the one or more feedback points.

* * * * *